Figure 1:
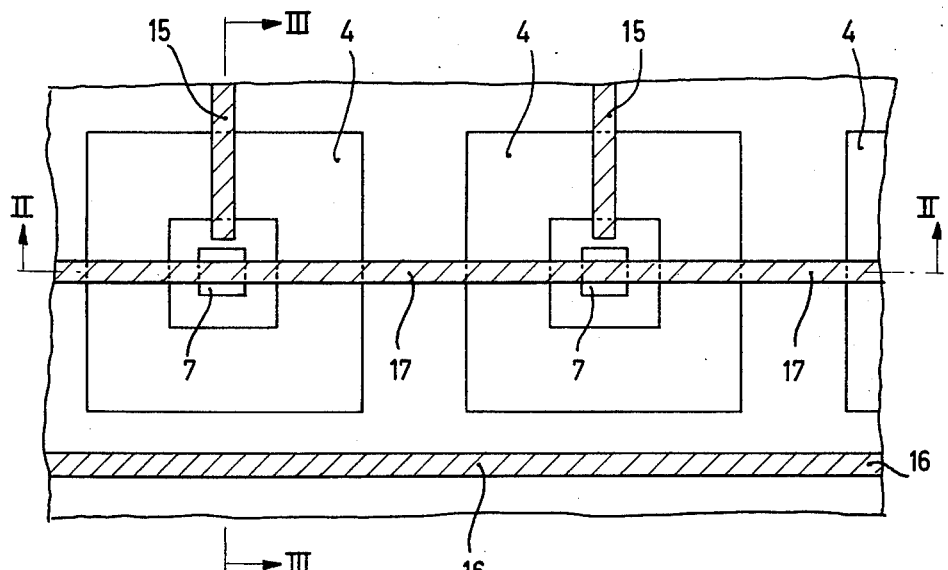

United States Patent [19]

Lohstroh

[11] 3,964,083
[45] June 15, 1976

[54] PUNCHTHROUGH RESETTING JFET IMAGE SENSOR

[75] Inventor: Jan Lohstroh, Eindhoven, Netherlands

[73] Assignee: U.S. Philips Corporation, New York, N.Y.

[22] Filed: May 30, 1974

[21] Appl. No.: 474,694

[30] Foreign Application Priority Data
June 14, 1973 Netherlands........................ 7308240

[52] U.S. Cl.................................... 357/30; 357/22
[51] Int. Cl.²................... H01L 27/14; H01L 31/00; H01L 29/80
[58] Field of Search.............................. 357/30, 22

[56] References Cited
UNITED STATES PATENTS

| | | | |
|---|---|---|---|
| 3,453,507 | 7/1969 | Archer | 317/235 |
| 3,721,839 | 3/1973 | Shannon | 307/304 |
| 3,887,936 | 6/1975 | Shannon | 357/30 |
| 3,893,151 | 7/1975 | Bosseloar | 357/23 |
| 3,894,295 | 8/1975 | Shannon | 357/19 |

*Primary Examiner*—Martin H. Edlow
*Attorney, Agent, or Firm*—Frank R. Trifari; Jack Oisher

[57] ABSTRACT

A solid-state picture pick-up device according to the invention comprises a number of field effect transistors in which the channel region is bounded by two oppositely located gate electrodes each forming a rectifying junction with the channel region and in which the photosensitive junction is formed by a gate electrode which shows a floating potential. Said gate electrode may be charged by simultaneously applying to the other gate electrode a voltage pulse of a sufficiently large amplitude so that punch-through occurs between the gate electrodes.

Since in this manner each transistor may be adjusted at its own threshold voltage, the influence of the spreading in the threshold voltages on the output signals is considerably reduced.

13 Claims, 12 Drawing Figures

PUNCHTHROUGH RESETTING JFET IMAGE SENSOR

The invention relates to a semiconductor device for converting radiation, e.g. an electromagnetic signal, into an electric signal, in particular a picture sensor, comprising a semiconductor body having a surface-adjoining layer-shaped region of one conductivity type in which a number of zones of the opposite conductivity type are embedded which each constitute a photosensitive element and which each form a gate electrode, hereinafter referred to as first gate electrode, of a field effect transistor having a source and drain region of one conductivity type adjoining the first gate electrode and an intermediately located channel region of one conductivity type.

Such a semiconductor device is described inter alia in the already published Dutch Pat. Application No. 7,203,662, corresponding to U.S. Pat. No. 3,721,839. During operation of this known semiconductor device the zones forming the photosensitive elements are charged electrically by reducing the number of majority charge carriers. When the zones are charged, in behalf of which the zones are temporarily connected to a voltage source, the pn-junction between each zone and the layer-shaped region is reversely biased in which a space charge region or depletion region is formed which blocks the channel region of the field effect transistors at least partly and hence results in a reduction of the conduction between the source regions and drain regions of the transistors. The said zones will preferably be charged to such an extent that the channel regions of the corresponding field effect transistors are entirely cut off.

After charging, the zones, in the subsequent integration period, not counting the normal thermal generation of charge carriers, can be discharged only as a result of absorption of electromagnetic radiation which is incident in and/or near the said depletion regions and which results in generation of electron-hole pairs. The quantity of radiation which has been incident and absorbed during an integration period in and/or near the channel region and results in a reduction of the thickness of the depletion region can be determined by measurement of the conduction of the channel region by conveying an electric current between the source region and the drain region. One of the important advantages of said way of measurement is that reading is non-destructive, that is to say, that during reading the electric charge which forms a measure of the quantity of radiation absorbed during the integration period is not lost. As a result of this, a stored signal can, for example, be read more than once, if desired. Moreover the influence of interference signals, for example, switching signals, can be considerably reduced during reading. A further important advantage of the described way of reading is that the electro-magnetic signal converted into electric charge occurs in an amplified manner in the output signal.

The known semiconductor devices described in the already mentioned Dutch Patent Application comprises a layer-shaped semiconductor region in the form of an n-type epitaxial silicon layer which is provided on a semiconductor substrate of p-type silicon. The gate electrodes or control electrodes of the field effect transistors are constituted by p-type annular surface zones which are provided in the n-type epitaxial layer and which enclose the drain regions (or source regions) of the field effect transistors and define the likewise annular channel regions between the gate electrodes and the substrate. During operation the p-n junction between the substrate and the epitaxial layer is reversely biased, for example, by setting up the substrate at a fixed negative potential in order to prevent holes from flowing from the substrate into the epitaxial layer and discharging the charged annular zones.

Upon absorption of equal quantities of trapped electromagnetic radiation, the field effect transistors should preferably give signals which are as uniform as possible. For this purpose it is necessary for the field effect transistors to show electric characteristics which are as uniform as possible.

Investigations underlying the present invention, however, have proved that the field effect transistors can show a rather large spread in their electric characteristics, even in the case in which the transistors are accommodated in the form of an integrated monolithic circuit in a common semiconductor body and are therefore subjected to the same manufacturing steps. In particular the threshold voltages of the field effect transistors can show a spread which may adversely influence the operation of the semiconductor device.

Since in general the same charging voltage is set up at the gate electrodes of all the field effect transistors and since said voltage is in general determined by the field effect transistor having the largest threshold voltage (in absolute value), field effect transistors having a smaller threshold voltage (in absolute value) can supply a signal during reading which, with a given quantity of incident and absorbed radiation, is actually too small. The spreading in the threshold voltage is caused in particular by a spreading in the thickness and the doping of the channel regions of the transistors.

So in general the field effect transistors will show a spreading in the electric characteristics which, upon absorption of a given quantity of radiation, results in a spread in the output signals supplied by the field effect transistors. Moreover this spread may be so large that a lower limit is imposed by it on the minimum quantity of radiation to be absorbed at which a reliable signal is still supplied by the transistors, so that inter alia "low level imaging" (with which the intensity of the incident radiation is only very small) may become difficult or in some cases can substantially not be carried out.

One of the objects of the invention is to provide a semiconductor device of the type described in the preamble in which the above-mentioned drawbacks can be avoided at least for the greater part.

The invention is inter alia based on the recognition that the influence of the spread in the threshold voltages of the field effect transistors on the output signals can be considerably reduced by adjusting, during charging, the gate electrode of each field effect transistor only to the associated threshold value of each individual transistor, so that upon absorption of equal quantities of electromagnetic radiation in transistors having different threshold voltages, said transistors, upon reading, will nevertheless give substantially the same output signals.

A semiconductor device of the type described in the preamble is therefore characterized according to the invention in that the said zones constituting first gate electrodes of the field effect transistors, considered electrically, are floating, and for charging said zones in which the p-n junctions between the zones and the layer-shaped region are reversely biased, each field effect transistor comprises a second gate electrode which is separated from the channel region by a rectifying junction and which comprises an electric connection, the channel regions of the transistor each extending between the first and the second gate electrode of the associated transistor.

In this connection, a zone or a region is deemed to have a floating potential if said zone or said region shows no electric connection, at least no connection as a result which the potential of the zone or the region in the presence of said connection would have a different value than in the absence thereof. This means that in most of the practical cases the gate electrodes which constitute the photosensitive p-n junctions with the layer-shaped semiconductor region, will not be connected to another point of the electric circuit via an electric connection. Since the said second gate electrode has an electric connection, a voltage may be applied to the second gate electrode at which the rectifying junction between the second gate electrode and the channel region is reversely biased and a depletion region is formed which extends in the channel region from said rectifying junction. The voltage at which said depletion region adjoins the photosensitive p-n junction between the said first gate electrode and the channel region and at which said p-n junction is biased in the forward direction, is often referred to by the English name of "punch-through" voltage. By applying, via the electric connections, a voltage to the said second gate electrode of each field effect transistor, which voltage, in absolute value, is larger than the punch-through voltage, majority charge carriers from the said first gate electrode of each relevant field effect transistor can be drained via the p-n junction between the first gate electrode and the channel region and via the depletion region in the channel region and the second gate electrode, the potential of the first gate electrode, again also in absolute value, increasing and the first gate electrode being charged to a given voltage. This voltage may be so large that when the voltage at the said second gate electrode is then removed, as a result of which the depletion region of the rectifying junction between the second gate electrode and the channel region disappears substantially entirely, punch-through occurs from the said first gate electrode to the second gate electrode. As a result of this the voltage at the second gate electrode is reduced to such an extent that the channel region is still just blocked entirely by a depletion region which extends from the photosensitive p-n junction into the channel region. The voltage of the first gate electrode is then substantially equal to the threshold voltage associated with the relevant transistor. This means that also in the case of absorption of small quantities of electromagnetic radiation a conductive channel will be formed during operation. In a semiconductor device according to the invention the field effect transistors will therefore give substantially the same output signals with absorption of substantially equal quantities of electromagnetic radiation in spite of mutual differences in the threshold voltages.

Since in a semiconductor device according to the invention the spread in the output signals can be very small, the intensity of the radiation to be measured or of the picture to be observed may also be very small.

The said second gate electrode of each field effect transistor therefore serves to charge the said first gate electrode to a suitable voltage level and may consist, for example, of a metal layer which is provided on the surface of the semiconductor body and which forms a rectifying junction or a Schottky junction with the semiconductor material. A preferred embodiment of the semiconductor device according to the invention is characterized in that the second gate electrodes of the field effect transistors are constituted by a semiconductor region of the opposite conductivity type which forms a rectifying junction in the form of a p-n junction with the channel region of the associated field effect transistor. The second gate electrodes may be constituted by zones of the opposite conductivity type which are provided in the layer-shaped region and which are separated from each other laterally and adjoin the surface of the semiconductor body at least locally. The gate electrodes of the field effect transistors may be addressed separately and, if desired, after each other, for example, when charging the said first gate electrodes and/or upon reading. Other features of the invention will become apparent from the detailed description that follows.

Figure 2:
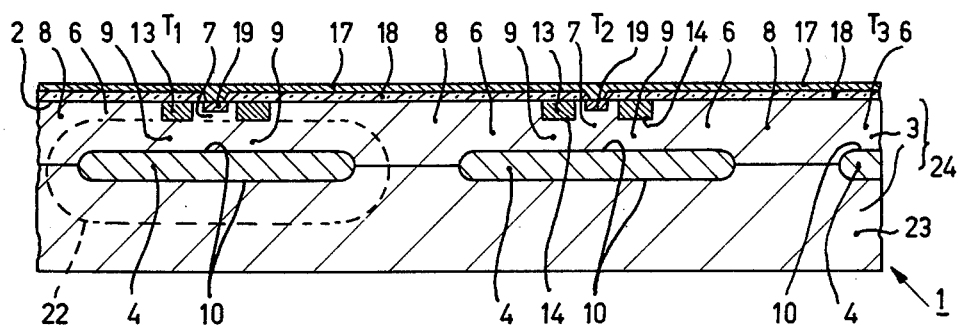
Figure 3:
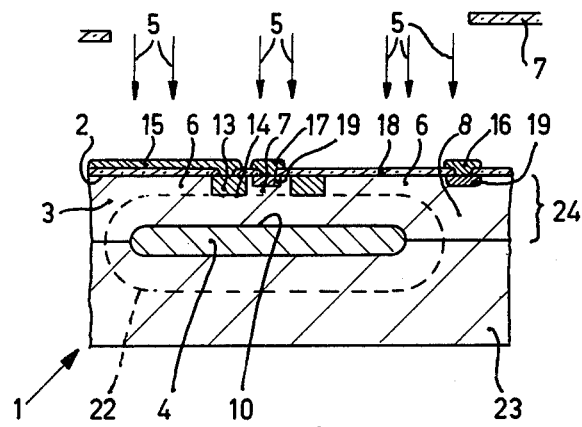
Figure 4:
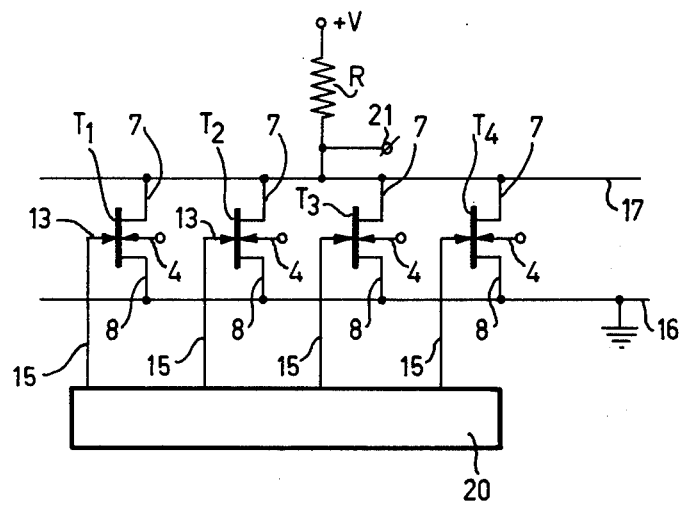
Figure 5:
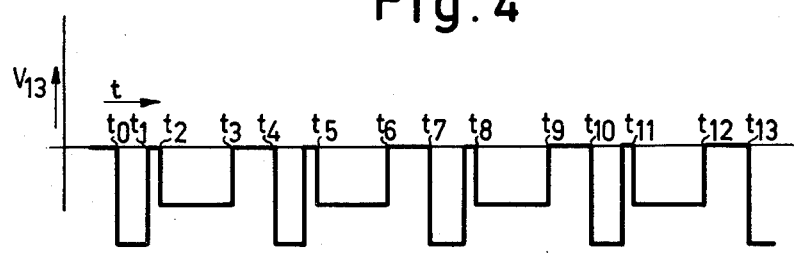
Figure 6:
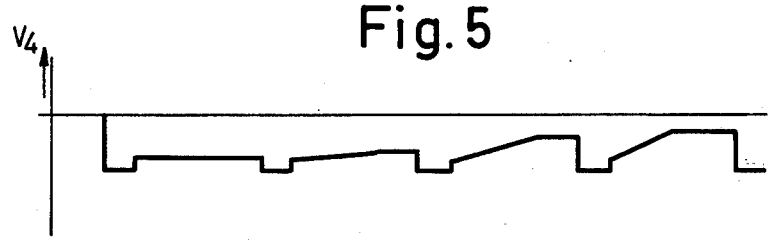
Figure 7:
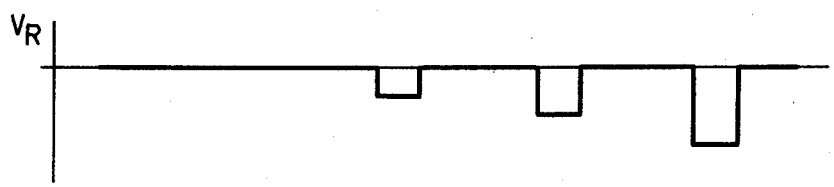
Figure 8:
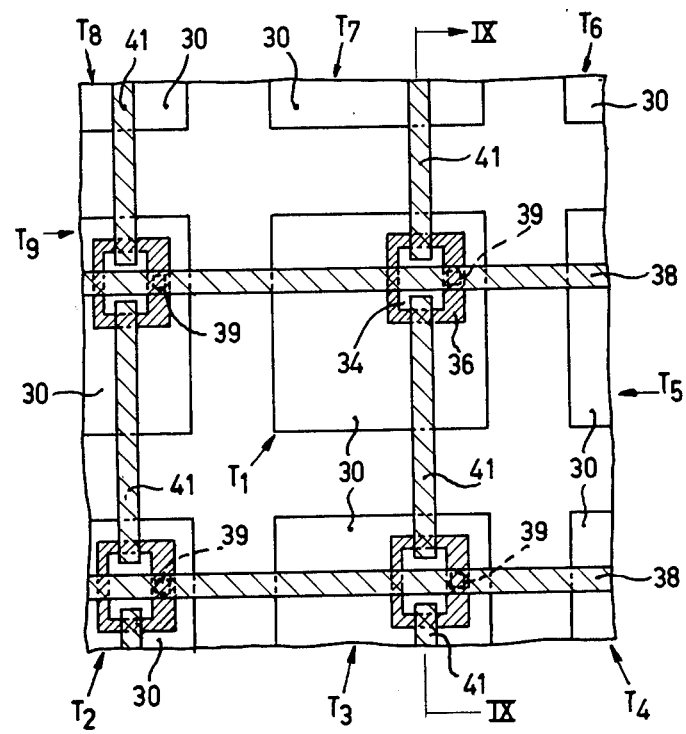
Figure 9:
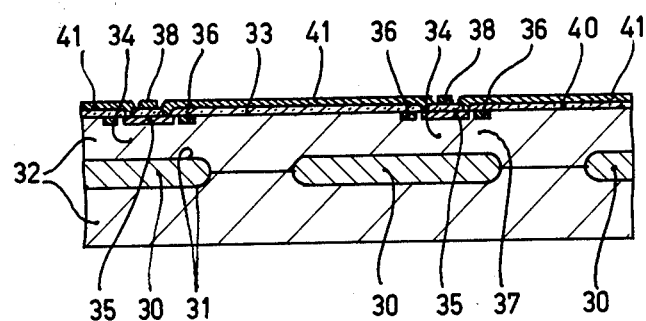
Figure 10:
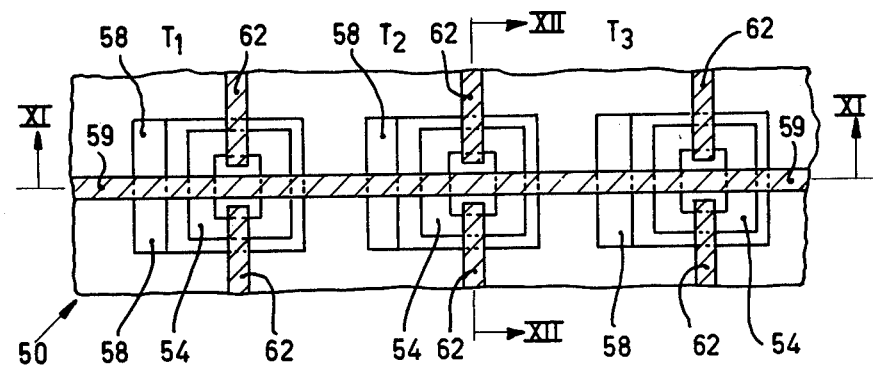
Figure 11:
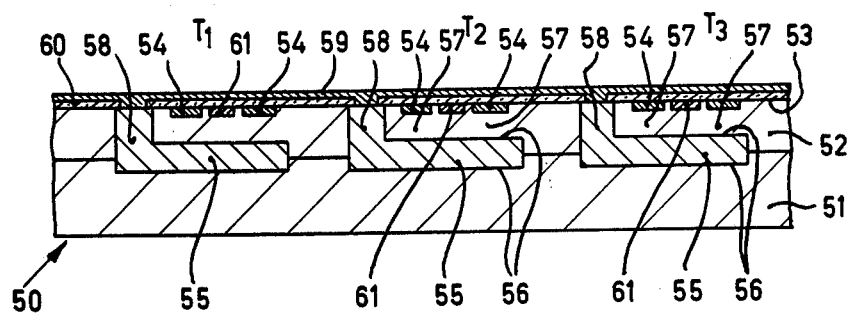
Figure 12:
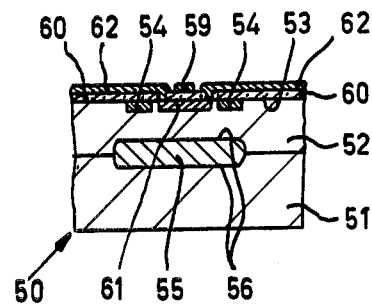

The invention will now be described in greater detail with reference to a few embodiments and the accompanying diagrammatic drawing, in which FIG. 1 is a plan view of a part of a semiconductor device according to the invention, and of which, FIG. 2 is a cross-sectional view taken on the line II—II of FIG. 1 and FIG. 3 is a cross-sectional view taken on the line III—III of FIG. 1, FIG. 4 shows an electric circuit diagram of the semiconductor device shown in FIG. 1, FIG. 5 shows the voltage to be applied to the gate electrodes of the semiconductor device shown in FIG. 1 as a function of the time $t$, FIG. 6 shows the potential of the floating gate electrodes of the transistors of the semiconductor device shown in FIG. 1 as a function of the time $t$, FIG. 7 shows electric output signals derived from the output of the semiconductor device shown in FIG. 1, FIG. 8 is a plan view of a part of a second semiconductor device according to the invention of which FIG. 9 is a cross-sectional view taken on the line IX—IX of FIG. 8, FIG. 10 is a plan view of a part of a third semiconductor device according to the invention, of which, FIG. 11 is a cross-sectional view taken on the line XI—XI of FIG. 10, and of which FIG. 12 is a cross-sectional view taken on the line XII—XII of FIG. 10.

FIG. 1 is a plan view and FIGS. 2 and 3 are cross-sectional views of a part of a semiconductor device according to the invention destined for converting an electromagnetic signal into an electric signal. Such a semiconductor device which may be used inter alia as a picture or image sensor or as a character recognition device may be operated in the charge storage mode in which the output signal forms a measure of the quantity of radiation which is incident during a finite time interval. The radiation which is denoted by the arrows 5 in FIG. 3 may be concentrated on the semiconductor device with the aid of means 7 (see FIG. 3) which may comprise, for example, a lens and/or a diaphragm.

The device comprises a semiconductor body 1 of silicon. Of course, instead of silicon, other suitable semiconductor materials may be used, for example germanium.

The semiconductor body 1 comprises an n-type layer-shaped region 3 which adjoins the surface 2 and in which a number of p-type zones 4 are embedded each forming a photosensitive element. Said zones furthermore each form a gate electrode, hereinafter termed first gate electrode, of a field effect transistor.

The field effect transistors of the semiconductor device of which FIGS. 1 and 3 only show the transistors $T_1$, $T_2$ entirely and $T_3$ only partly, each comprise an n-type source region 8 adjoining the first gate electrode, an n-type drain region 7, and an n-type channel region 9 which is present between the source region 8 and the drain region 7 and of which during operation the conduction forms a measure of the potential of the associated gate electrode 4.

Electrically the zones 4 are floating in which in this connection a zone or a region is considered to have a floating potential if said region or zone shows no electric connection, at least no connection as a result of which the potential of the zone or the region in the presence of said connections would have a different value than in the absence thereof. In the present embodiment the zones 4 are not provided at all with an electric connection or a contact.

For charging the zones 4, in which the p-n junctions 10 between the zones 4 on the one hand and the channel regions 9 of the field effect transistors on the other hand are reversely biased, each field effect transistor $T_1$, $T_2$, $T_3$ has a second gate electrode 13 which is separated from the channel region 9 by a rectifying junction 14, the channel region 9 being present between the first gate electrodes 4 and the second gate electrode 13. The second gate electrodes 13 each comprise an electric connection 15 via which the gate electrodes 13 can each be connected to a voltage source and as a result of which the first gate electrodes 4 can each be charged, as will become apparent hereinafter.

The second gate electrodes 13 of the field effect transistors in the present embodiment each comprise a p-type surface region which forms a p-n junction 14 with the n-type layer-shaped region 3 of the semiconductor body 1 and which has an electric connection contact 15. As is apparent from the figures, the gate electrodes 13 of the field effect transistor are provided in the form of p-type zones which are provided in the n-type layer-shaped region 3, are mutually separated laterally, and adjoin the surface 2 of the semiconductor body 1.

These zones are annular and, viewed on the surface, enclose parts of the layer-shaped region 3 which belong to the drain regions 7 of the transistors, the parts of the layer-shaped region 3 present outside the annular zones belonging to the source regions 8 of the transistors. Of course, the functions of the source regions 8 and the drain regions 7 may be interchanged, the regions 7 thus forming the source regions and the parts 8 forming the drain regions of the transistors. However, the part 7 of the layer-shaped region 3 enclosed by an annular zone will hereinafter be considered to be the drain region of a transistor.

The said first gate electrode 4 of each field effect transistor is constituted by a buried zone provided in the layer-shaped region 3, the channel region 9 of each field effect transistor extending between such a buried zone and the second gate electrode 13. The buried p-type zones or gate electrodes 4 which constitute the photosensitive elements may be charged electrically by means of the surface zones or gate electrodes 13 as will be described hereinafter.

Viewed on the surface 2, each second gate electrode formed by a surface zone 13 is present entirely above the buried zone 4 of the relevant transistor. In order to increase the photosensitivity, the buried zone 4 projects beyond the edges of the surface zone 13 over such a distance that the surface of the part of the buried zone which extends beyond the edge of the surface zone 13 is more than half of the overall area of the buried zone 4. Since a large part of the electromagnetic radiation which is incident on the semiconductor device from the side of the surface 2 and which is denoted diagrammatically in FIG. 3 by the arrows 5, can reach the photosensitive part of each transistor without passing through the second gate electrode, the absorption in the second gate electrode can be restricted to a comparatively small fraction. The absorption of a large part of the incident radiation 5 with the associated generation of electron-hole pairs may therefore take place in a depletion region of the layer-shaped region 3 which is directly achievable for the incident radiation from the said surface 2, so that the sensitivity of the device described may be large in particular to short-wave light. Moreover, in order to further increase the photosensitivity, the part 6 of the layer-shaped region 3 which is present above the said part of the buried zone 4 projecting beyond the edge of the surface zone 13 and which extends from the surface 2 down to the buried zone 4 shows a comparatively long life for the majority charge carriers. In connection herewith, said part 6 which may obtained, for example, by epitaxial growth, has a comparatively low doping concentration. The concentration of activators of one type, in this case n-type, in the part 6 of the region 3 is preferably smaller than the concentration of activators of the other type, in this case p-type, in the surface zone 13.

The device comprises a source zone 8 which is common to the field effect transistors having a common source electrode 16 and a common drain electrode 17. The electrodes 15, 16 and 17 are formed by tracks of conductive material, for example, aluminum, and are separated from the layer-shaped region 3 of the semiconductor body 1 by an insulating layer 18 of, for example, silicon oxide. The oxide layer 18 which is assumed to be transparent (or at least permeable to the radiation to be detected) and is not shown in FIG. 1 for clarity, has contact apertures (see FIGS. 2 and 3) via which the metal layers 16 and 17 are contacted to the underlying semiconductor material. In order to obtain ohmic contacts, contact zones 19 which have the same conductivity type as and a higher doping than the high-ohmic region 3 are provided in the oxide layer 18 at the area of the contact apertures. The oxide layer 18 has also contact apertures for contacting the second gate electrode 13. The contact apertures and contact zones 19 are not shown either in FIG. 1 for clarity.

The operation of the semiconductor device shown in FIGS. 1 to 3 will now be described in greater detail with reference to FIGS. 4 to 7. FIG. 4 is an electric equivalent circuit diagram of the semiconductor device shown in the preceding figures comprising a number of field effect transistors $T_1$, $T_2$, $T_3$ and $T_4$ having one or more common source zones (or drain zones) 8 denoted diagrammatically by the line 16 and the drain zones 7 interconnected by the line 17. Also shown in this figure are the electrically floating gate electrodes 4 forming the photosensitive elements and the second gate electrodes 13 comprising an electric connection 15. The channel regions of the transistors are present between the floating gate electrodes 4 and the second gate electrodes 13.

Shown diagrammatically by a block diagram 20 are in addition means to apply a voltage, via the electric connections 15, to the second gate electrodes of each field effect transistor, punch-through occurring between the said second gate electrode and the associated electrically floating first gate electrodes, the said first gate electrodes being charged electrically. The value of the voltages to be applied to each of the second gate electrodes is not critical and may each time be chosen, for example, to be very much larger than the punch-through voltage between the first gate electrode and the second gate electrode associated with each relevant field effect transistor. Preferably, the means 20 comprise inter alia a voltage source by means of which a voltage can be applied to the second gate electrodes 15 which voltage, in absolute value, is at least equal to twice the minimum voltage which is necessary to produce punch-through between the first and the second gate electrode in each field effect transistor $T_1$, $T_2$, $T_3$, and so on. Irrespective of the spreading in the threshold voltages of the field effect transistors, the said first gate electrodes 4 in each of the field effect transistors can hereby be charged to substantially the threshold voltage in each individual transistor, it being nevertheless possible to apply voltages of the same value to the second gate electrodes of the field effect transistors.

A feature of the invention is that, since the said second gate electrodes 13 do not serve as radiation detecting elements, said gate electrodes may moreover be used for selection or as addressing means. Therefore, in the present embodiment, a reverse voltage is applied to the associated second gate electrodes 13 after charging the floating gate electrodes 4 of the field effect transistors forming the photosensitive elements. Said reverse voltage (in absolute value) is preferably equal to the punch-through voltage between the floating gate electrodes 4 and the second gate electrodes 13 and in practice is chosen to be a fraction larger.

FIG. 5 shows by way of example the voltage $V_{13}$ which is applied to the second gate 13 of the field effect transistor $T_1$ with the aid of the means 20 as a function of the time t. Besides to the gate electrode of the transistor $T_1$, the voltage $V_{13}$ may of course also be applied, although always with a certain phase difference, to the gate electrodes 13 of the remaining field effect transistors.

As shown in FIG. 4, the common drain electrodes 17 is connected, via a read-out resistor R, to a fixed potential which is denoted by +V and which may be, for example, +10 Volt. The electric output signal may be derived from the connection terminal 21.

The source zone or source zones 8 are connected, via the conductor 16, to a reference potential, for example, ground, so that in behalf of reading of the device a voltage difference is present between the source zones and drain zones of the transistors.

As shown in FIG. 5, a negative voltage pulse of approximately 16 Volts is applied to the gate electrode 13 of field effect transistor $T_1$ at the instant $t_o$. It is assumed that the punch-through voltage between the gate electrodes 13 and the associated floating gate electrodes 4, which punch-through voltages generally depend upon the general thickness and the doping concentration of the channel 9 and the gate electrodes 4 and 13, in the present embodiment is approximately 7 Volts with a spread of approximately 0.5 Volt.

Therefore, due to the voltage applied to the gate electrode 13, punch-through occurs between the gate electrode 13 and the oppositely located floating gate electrode 4, in which a depletion region 4 extends from the gate electrode 13 through the channel region 9 down to the floating gate electrode 4, the p-n junction of said gate electrode is biased in the forward direction, and the gate electrode 4 is charged electrically to approximately −9 Volts. FIG. 6 shows diagrammatically the variation of the potential of the buried gate electrode 4 as a function of the time t.

At the instant $t_1$ in FIG. 5, the potential of the second gate electrode 13 is again reduced to 0 Volt. Because the voltage difference between the first gate electrode 4 and the second gate electrode 13 cannot exceed the punch-through voltage between the first gate electrode 4 and the second gate electrode 13, the potential of the gate electrode 4 increases to a value at which the channel region 9 is just cut off by the depletion region 22 which is shown in broken lines in FIGS. 2 and 3. The potential of the buried gate electrode now is substantially equal to the threshold voltage of the transistor which is approximately 7 Volts with a spread of approximately 0.5 Volt.

At the instant $t_2$ a negative voltage of approximately −8 Volts is applied to the gate electrode 13. Said voltage which has no or substantially no effect on the potential of the buried gate electrode 4 serves to ensure that during the subsequent integration period no current starts flowing between the source zone 8 and the drain zone 7 in spite of the voltage difference between the source zone 8 and the drain zone 7.

In the case in which no electromagnetic radiation is incident in the depletion region 22 during the integration time between $t_2$ and $t_3$, the potential of the buried gate electrode 4 is maintained at approximately −7 Volts, it being assumed that the influence of charge carriers generated thermally in the integration time is negligible. During the subsequent read-out period, $t_3$-$t_4$, the potential of the second gate electrode 13 is again brought at 0 Volt as is shown in FIG. 5. Since, however, the channel region 9 remains entirely cut off by the depletion zone or the depletion region 22, substantially no current can flow between the source zone 8 and the drain zone 7 so that no signal will be observed at the output terminal 21.

Subsequently, in a subsequent cycle, the buried gate electrode 4 is charged again after which a new integration period from $t_5$ to $t_6$ follows during which a quantity of radiation 5 is incident in and/or near the depletion region 22 and is absorbed there while generating hole-electron pairs which result in a discharge of the floating gate electrode 4. The potential of the floating gate electrode 4 will therefore increase as is shown diagrammatically and by way of example in FIG. 6. As a result of the smaller reverse voltage across the p-n junction 10, the thickness of the depletion region 22 decreases so that between the source zone 8 and the drain zone 7 a direct conductive channel can be formed dependent on the voltage at the second gate electrode 13. Since the floating gate electrode had been adjusted at substantially the threshold voltage of the field effect transistor, the conduction of said conductive channel is determined substantially only by the quantity of incident radiation and is not or only to a small extent influenced by the spread in the threshold voltage, which spread can be caused in particular by a spread in the thickness and doping of the channel region 9.

During reading ($t_6-t_7$) the potential of the second gate electrode is again brought to 0 volt so that at the given voltage difference a current can flow between the source zone 8 and the drain zone 7 which causes an electric signal at the output terminal 21 (see FIG. 7).

It is to be noted that the reading of the signal stored in the gate electrode 4 is not destructive and may as a result take place inter alia during such a long time interval that no trouble is experienced any longer from switching pulses which usually are superimposed upon the output signal.

In the subsequent cycle consisting of the charging of the zone 4 in which the generated charge carriers are removed again ($t_7-t_8$), the integration period $t_8-t_9$, and the reading ($t_9-t_{10}$), the case is shown by way of example that the radiation 5 which is incident in and/or near the depletion region 22 has a larger intensity than the radiation which is incident during the time interval between $t_5$ and $t_6$, and is absorbed. The potential of the floating gate electrode (buried zone) hereby increases more than in the time interval between $t_5-t_6$, and hence the conduction in the channel region 9.

In the next cycle consisting of the charging of the zone 4 ($t_{10}-t_{11}$), the integration time ($t_{11}-t_{12}$), and the reading ($t_{12}-t_{13}$) the case is shown by way of example that the semiconductor device is overexposed. The intensity of the incident radiation is so large that the depletion regionn 22, in the absence of a voltage at the second gate electrode 13, might disappear entirely. Since, however, a potential of approximately -8 Volts is applied to the second gate electrode, punch-through occurs from the second gate electrode 13 to the buried zone 4 when the potential of the buried zone 4 reaches a value of approximately −1 Volt. As a result of this and irrespective of the further incident radiation, the potential of the buried zone 4 is maintained at approximately −1 Volt, the channel region 9 being entirely cut off by on the one hand the reverse p-n junction 10 and on the other hand the reverse p-n junction 14, so that an electric current can flow between the source zone 8 and the drain zone 7 only during the read-out period between $t_{12}$ and $t_{13}$.

The other field effect transistors $T_2$, $T_3$ and so on can be operated in analogous manner in which, for example, the voltages shown in FIG. 5 are successively applied to the second gate electrodes 13 so that each time successively an output signal can be derived from the output terminal 21, which signal is a measure of the quantity of radiation which has been incident in and/or near the gate electrode 4 of each transistor. Due to the described way of operation, in which each transistor is each time adjusted at the individual threshold voltage associated with the transistor during the charging of the buried zones 4, the transistors $T_1$, $T_2$, $T_3$ and so on will give substantially the same output signals upon absorption of the same quantities of electromagnetic radiation, irrespective of the spreading in the threshold voltages. As a result of this the device described is particularly suitable for detecting radiation of an only very small intensity.

Starting material for the manufacture of the semiconductor device described is an n-type semiconductor substrate 23 which belongs to the layer-shaped region 3. The thickness and the resistivity of the substrate 23 are approximately 250 μm and 1 ohm.cm, respectively, or higher. The latter resistivity is preferably at least 5 ohm. cm.

The substrate 23 is provided locally with p-type surface zones from which the buried zones 4 can be formed in a later production stage.

In a manner conventionally used in semiconductor technology, and n-type epitaxial layer 24 which also belongs to the layer-shaped region 3 is grown on the substrate 23. The thickness and the resistivity of the layer 24 are approximately 5 to 7 μm and approximately 5 ohm.cm, respectively. During the growth of the epitaxial layer 24-and during possible further thermal treatments of the semiconductor device to the manufactured- the impurities diffuse from the p-type surface zones provided in the substrate 23 into the epitaxial layer 24 and, at the area of the interface between the epitaxial layer 24 and the substrate 23, from the buried p-type zones 4. The latter dimensions of the zones 4 may be chosen in accordance with the use of the semiconductor device and in the present embodiment are approximately 300 × 300 μm.

The thickness of the epitaxial layer 24 and the doping concentration of said layer, as well as the ultimate thickness of the buried zones 4 which are also decisive of the threshold voltages of the field effect transistors, generally show some spreading which results in a spreading in the threshold voltages of approximately 0.5 Volt. Said spreading, however, has substantially no influence on the electric output signals of the semiconductor device, as has already been described.

The annular p-type surface zones 13 which form the second gate electrodes of the transistors and the n-type contact zones 19 are then provided in the epitaxial layer 24 grown on the substrate 23 by means of diffusion or by means of ion implantation. By depositing aluminum and by means of the conventional photo-etching techniques, the contacts 15 and 16 may be provided which are contacted, via contact holes in the insulating layer 18, with the surface zones 13 and the contact zones 19, respectively. The thickness of the n-type zones 13 is approximately 0.5 μm, the thickness of the channel region 9, being for example, approximately 2 μm. With this thickness of the channel region 9 and at the given doping concentration in the channel region 9 (epitaxial layer 24) the punch-through voltage is approximately 7 Volts.

The lateral dimensions of the second gate electrodes 13, measured along the outer edge, are approximately 25 × 25 μm and, measured along the inner edge approximately 15 × 15 μm. Viewed on the surface 2, the buried zones 4 extend far beyond the edges of the second gate electrode so that the quantity of radiation which is received during operation in and/or near the second gate electrodes 13 and which does not effectively contribute to the photosensitivity of the device is comparatively small. A feature of this embodiment is that at least one of the gate electrodes of the field effect transistors is constituted by an annular surface zone of the opposite conductivity type provided in the layer-shaped region of one conductivity type, the parts of the layer-shaped region which, viewed on the surface, are enclosed by the annular zones belonging to the source regions or the drain regions of the field effect transistors. It is to be noted that the term "annular" is to be understood to mean herein any such shape in which the gate electrode encloses the source or drain region of a transistor so that any closed or at least nearly closed zone is also included.

In the first embodiment described above, the semiconductor device comprises a linear row of photosensitive elements and may be used, for example, for character recognition. FIG. 8 is a plan view and FIG. 9 is a cross-sectional view taken on the line IX—IX of FIG. 8 of a part of a second embodiment of a semiconductor device according to the invention having a two-dimensional matrix of photosensitive elements. Said photosensitive elements are formed, as in the preceding embodiment, by p-type buried zones 30 which form a p-n junction 31 with the layer-shaped n-type region 32 and which each form an electrically floating gate electrode of a field effect transistor. The field effect transistors of which FIG. 8 only shows the transistor $T_1$ entirely and the transistors $T_1$ entirely and the transistors $T_2$–$T_3$ only partly, each comprise a drain zone 34 which adjoins the surface 33 of the layer-shaped region and which has a low-ohmic contact zone 35 which, as the layer-shaped region 32, shows the n-conductivity type but has a higher doping concentration than the layer-shaped region. It is to be noted that the contact zones 35 are not shown in FIG. 8 for clarity.

Viewed on the surface 33, the drain zones (34,35) are each surrounded entirely by annular p-type surface zones 36 each forming a second gate electrode of the relevant field effect transistors.

The second gate electrodes 36 and the electrically floating buried gate electrodes 30 define an intermediately located channel region 37. The field effect transistors $T_1$–$T_3$ furthermore comprise source zones, which, as in the preceding embodiment are common and will hereinafter be referred to by reference numeral 32. The layer-shaped region 32 may be provided, at the area of the surface 2 or on the lower side, with an electrode which is not further shown and which forms a source electrode which is common to the transistors $T_1$–$T_3$.

The said second gate electrode 36 serve for electrically charging the buried gate electrodes 30 and in behalf of this are provided with electric connections in the form of substantially parallel metal strips 38 which are contacted to the gate electrodes 36 at the area of the contact apertures 39. The contact apertures 39 are provided in an insulating layer 40 which is provided on the surface 32 and which is not shown in FIG. 8 for clarity.

The drain zones (34,35) also comprise electric connections in the form of metal strips 41 which are contacted to the contact zones 35. As shown in FIGS. 8 and 9, the low-ohmic n-type contact zones 35 serve as underpasses for the electric connections 41, each contact zone 35 being each time contacted two times to the metal strips 41. The metal strips 38 cross the contact zones 35 and are separated therefrom by the insulating layer 40 so that a single-layer wiring will suffice. The pattern of crossing metal strips 38 and 41 may also be situated so that the crossings fall outside the field effect transistors. In that case, underpasses for the crossings diffused in the region 32 may be provided. The zones 34, 35 and 36 of the field effect transistors may then be constructed, for example, to be smaller so that the photosensitive area per transistor necomes relatively larger. This advantage may also be achieved by using double-layer wiring in which generally space is also saved at the surface.

During operation, voltages as shown in FIG. 5 may be applied to the electric connections 38. For example, the field effect transistors belonging to the same horizontal row may be charged each time simultaneously. All the field effect transistors may also be charged simultaneously. The charge condition of the first gate electrodes belonging to such a row of field effect transistors and formed by the buried zones 30, which determines the conduction in each of the channel regions 37 and forms a measure of the quantity of absorbed electromagnetic radiation, may be determined, for example, by applying a voltage pulse to the drain zone (34,35) to be addressed via the metal contact strip 41 of the column of field effect transistors to which the transistor to be selected belongs (for example, the column to which the transistors $T_7$, $T_1$ and $T_3$ belong), so that a current will flow between the source zone 32 and the addressed drain zone (34,35) which forms a measure of the conduction of the channel region 7 and hence of the charge condition of the buried zone 30 of the relevant field effect transistor. The field effect transistors belonging to the same horizontal row may also be read simultaneously by applying a voltage simultaneously to all the electric connections 41. The output signals supplied by the transistors may be introduced, for example, to a shift register and then be derived sequentially at the output of the shift register.

The electric current between the source region 32 and each of the drain regions (34,35) forms a reliable measure of the quantity of absorbed radiation in that, due to the way of charging which has already been described with reference to the preceding embodiment, the buried gate electrode 30 of each transistor is electrically charged to substantially the punch-through voltage of said transistor. As a result of this, upon absorption of radiation, a conductive channel will immediately be formed in each transistor between the source zone and the drain zone, while in the absence of radiation the channel region remains cut off by the reverse p-n junction between the channel region 37 and the buried zone 30.

In the present embodiment, the electrically floating gate electrodes which form the photosensitive elements are formed, as in the preceding embodiment, by p-type buried zones between a substrate and an epitaxial layer of the n-type. In order to increase the photosensitivity of the device, the dimensions of the buried zones are chosen to be large as compared with the dimensions of the second gate electrodes which are formed by p-type surface zones and which serve to electrically charge the buried zones. As a result of this, the fraction of the total quantity of incident radiation which is incident in and-/or near the said gate electrodes and therefore does not or substantially not contribute to the discharge of the buried zones is comparatively small.

In a number of applications, however, the photosensitive elements may advantageously be constituted by surface zones, as will now be described with reference to FIGS. 10, 11 and 12.

FIG. 10 is a plan view of a third embodiment of a part of a semiconductor device according to the invention, which part comprises three transistors $T_1$, $T_2$ and $T_3$ which may form part of a linear row of field effect transistors, for example, the transistors $T_1$–$T_3$ in the first embodiment, or which may form part of a two dimensional matrix of field effect transistors with reference to the preceding embodiment. FIGS. 11 and 12 are cross-sectional views of the semiconductor device taken on the lines XI—XI and XII—XII, respectively.

The transistors $T_1$, $T_2$, $T_3$ and so on are provided in a semiconductor body 50 which consists of a substrate 51 of n-type silicon having grown thereon an epitaxial layer 52 likewise of n-type silicon. As in the preceding embodiments, the field effect transistors according to the invention comprise two gate electrodes, namely a gate electrode which is constituted by a semiconductor zone which also forms a photosensitive element and a gate electrode which is destined to charge the first-mentioned gate electrode electrically.

Other than in the preceding embodiments, however, the said first gate electrodes in the present embodiment which constitute the photosensitive elements are each formed by a p-type surface zone 54 adjoining the surface 53 of the semiconductor body 50.

The said second gate electrodes which serve to charge the electrically floating gate electrodes 54 electrically each comprise a part in the form of a p-type buried zone 55 provided near the interface between the epitaxial layer 52 and the substrate 51 and forming a p-n junction 56 with the semiconductor body 50.

Viewed on the surface 53, the buried zones 55 are present below the surface zone 54 and each determine an intermediately located channel region 57 of the transistors $T_1$, $T_2$, $T_3$ and so on with the surface zones 54.

Via a p-type contact zone 58 which adjoins the surface 53 of the semiconductor body 50 and which extends from the surface 53 down to the buried zone, the buried zones 55 are each connected to an electric connection. Said electric connection furthermore comprises a metal contact in the form of an aluminum strip 59 which is contacted to the contact zones 58 via contact holes in an oxide layer 60 provided on the surface 55 (and not shown in FIG. 10 for clarity).

The surface zones 54 are annular or show at least a closed geometry and each enclose the drain region 61 of the associated field effect transistors. The drain regions 61 each comprise a low-ohmic, highly doped n-type contact zone which, as the contact zones 35 in the preceding embodiment, may serve as a an underpass below the aluminum strip 59 in behalf of the aluminum strips 62 which are contacted to the drain zones 61 and form the drain electrodes.

Since, unlike the preceding embodiment, the buried zones 55 do not form the photosensitive elements, the dimensions of said zones may be comparable to those of the annular surface zones 54. Although the sensitivity of the semiconductor device according to the present embodiment may be smaller than the sensitivity of the semiconductor devices according to the preceding embodiments, dependent upon the wavelength of the incident radiation, the structure will generally be more compact, which is of advantage for a number of applications.

The semiconductor device may be operated in manner similar to the operation of the semiconductor device according to the preceding embodiment, in which the gate electrodes 55 are connected, for example, via the electrodes 59, to a voltage source which supplies a similar voltage as is shown in FIG. 5. The electrically floating gate electrodes 54 are charged electrically for each integration period to a voltage level which is substantially equal to the threshold voltage of each transistor. The influence of the spreading in the threshold voltages on the output signals is considerably reduced hereby, so that the transistors, upon absorption of quantities of electromagnetic radiation, will supply substantially equal output signals.

The semiconductor device may be manufactured in a manner analogous to the semiconductor device according to the first embodiment, with the difference that after growing the epitaxial layer 52 and prior to providing the p-type surface zone 54 a deep p-type diffusion is carried out locally so as to obtain the p-type contact zones 58.

It will be obvious that the invention is not restricted to the examples described but that many variations are possible to those skilled in the art without departing from the scope of the invention.

For example, the conductivity types of the various semiconductor regions and zones may be inverted, in which, of course the polarity of the voltages to be applied during operation should also be reversed. Furthermore, instead of silicon, other suitable semiconductor materials, for example, $A_{III}$-$B_V$ compounds, may also be used. The electric connections may be manufactured from, for example, polycrystalline silicon instead of from aluminum.

Instead of successively, the transistors may be read simultaneously, for example, per row, in which the output signals are supplied to a shift register and can be read sequentially at the output of the shift register.

In addition to the field effect transistors, further circuit elements may also be provided in the semiconductor body and form an integrated circuit with the photosensitive field effect transistors and may form part, for example, of the xy-selection of the semiconductor device.

Furthermore, instead of an n-type substrate a p-type substrate may also be used, in which the p-type buried gate electrodes are separated from the substrate by locally provided buried n-type zones.

What is claimed is:

1. A semiconductor imaging device, comprising a common semiconductor body comprising an array of plural field effect transistors each having a first gate electrode, a source region and a drain region of one type conductivity adjoining the first gate electrode and defining therebetween a one type conductivity channel region, said first gate electrode comprising a zone of the opposite type conductivity forming a photosensitive p-n junction with the channel region, said first gate zones being electrically floating, some of said field effect transistors having different threshold voltages, and means for electrically charging the first gate zones of each transistor to a reverse potential substantially equal to its threshold voltage producing a depletion region extending from the photosensitive p-n junction in each transistor that just blocks the channel region, whereby the absorption of substantially equal quantities of radiation by each transistor will cause substantially the same change in conduction of its channel.

2. A semiconductor imaging device, comprising a common semiconductor body comprising plural field effect transistors each having a first gate electrode, a source retion and a drain region of one type conductivity adjoining the first gate electrode and defining therebetween a one type conductivity channel region, said first gate electrode comprising a zone of the opposite type conductivity forming a photosensitive p-n junction with the channel region, said first gate zones being electrically floating; and means for electrically charging said first gate zones to a reverse potential producing a depletion region extending from the photosensitive p-n junction across the channel region, absorption of radiation causing retraction of the depletion region, said first gate charging means comprising for each transistor a second gate electrode located adjoining the channel region so that the latter extends between the first and second gate electrodes and forming a rectifying junction with the channel region and an electrical connection to the second gate electrode for applying a voltage thereto; and means connected to the source and drain regions of each transistor for deriving an electrical signal indicating the conduction condition of each channel region.

3. A semiconductor device as claimed in claim 2, wherein the said second gate electrodes of the field effect transistors are formed by a semiconductor region of the opposite conductivity type which forms a p-n junction with the channel region of the associated field effect transistor.

4. A semiconductor imaging device as claimed in claim 2 wherein the body comprises a surface-adjoining layer-shaped region of one-type conductivity, said first gate zones being located at least partly in said layer-shaped region, and the second gate electrodes comprise opposite-type surface zones which are laterally separated from each other.

5. A semiconductor device as claimed in claim 4, wherein one of the gate electrodes of the field effect transistors is constituted by an annular surface zone of the opposite conductivity type provided in the layer-shaped region of one conductivity type, the parts of the layer-shaped region, which, viewed on the surface, are enclosed by the annular zones belonging to the source regions or the drain regions of the field effect transistors.

6. A semiconductor device as claimed in claim 4, wherein the said first gate electrodes are each constituted by a surface-adjoining surface zone of the opposite conductivity type, and the said second gate electrodes each comprise a part in the form of a buried zone of the opposite conductivity type which is present in the layer-shaped region and, viewed on the surface, is present below the said surface zone and is connected to the electric connection via a surface-adjoining contact zone of the opposite conductivity type.

7. A semiconductor device as claimed in claim 4, wherein viewed on the surface, the second gate electrode of each field effect transistor formed by a surface zone is present entirely above the first gate electrode of the associated field effect transistor formed by a buried zone, the buried zone extending beyond the edges of the surface zone.

8. A semiconductor device as claimed in claim 7, wherein the area of the part of the buried zone extending beyond the edge of the surface zone is at least half of the overall area of the buried zone.

9. A semiconductor device as claimed in claim 7, wherein the part of the layer-shaped region which is present above the said part of the buried zone extending beyond the edge of the surface zone and extending from the buried zone up to the surface shows a lower doping concentration than the said surface zone.

10. A semiconductor imaging device as claimed in claim 2 wherein the first gate charging means includes means for applying to the second gate electrical connection a pulsed voltage exceeding the punchthrough voltage between the first and second gate electrodes, the first gate retaining its charge in the absence of incident radiation when the pulsed voltage terminates.

11. A semiconductor device as claimed in claim 10, wherein the voltage to be applied to the said second gate electrode is at least equal to twice the punchthrough punch-through voltage between the said first and second gate electrodes.

12. A semiconductor imaging device as claimed in claim 10 and further including means for maintaining a reverse bias potential on the second gate subsequent to charging of the first gate during a storage interval and means for reducing the reverse bias potential on the second gate during a readout interval.

13. A semiconductor device as claimed in claim 12, wherein the applied reverse bias across the p-n junction between the second gate electrode and the associated channel region is at least equal to the punch-through voltage between the second gate electrode and the first gate electrode in the relevant field effect transistor.

* * * * *